(12) United States Patent
Kim et al.

(10) Patent No.: US 9,318,890 B2
(45) Date of Patent: Apr. 19, 2016

(54) TUNABLE CAPACITOR

(71) Applicant: HiDeep Inc., Bundang-gu, Seongnam-si, Gyeonggi-do (KR)

(72) Inventors: Bonkee Kim, Seoul (KR); Youngho Cho, Gyeonggi-do (KR); Donggu Im, Daejeon (KR); Bumkyum Kim, Daejeon (KR)

(73) Assignee: HIDEEP INC., Seongnam-si (KR)

( * ) Notice: Subject to any disclaimer, the term of this patent is extended or adjusted under 35 U.S.C. 154(b) by 36 days.

(21) Appl. No.: 13/854,519

(22) Filed: Apr. 1, 2013

(65) Prior Publication Data

US 2013/0258535 A1    Oct. 3, 2013

(30) Foreign Application Priority Data

Apr. 3, 2012  (KR) .................. 10-2012-0034575

(51) Int. Cl.
| | |
|---|---|
| *H02H 3/20* | (2006.01) |
| *H01L 27/02* | (2006.01) |
| *H01G 2/22* | (2006.01) |
| *H01G 5/40* | (2006.01) |

(52) U.S. Cl.
CPC . *H02H 3/20* (2013.01); *H01G 2/22* (2013.01); *H01G 5/40* (2013.01); *H01L 27/0248* (2013.01); *H01L 27/0266* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,654,574 | A * | 8/1997 | Williams | H02H 9/042 257/173 |
| 6,530,062 | B1 * | 3/2003 | Liaw et al. | 716/126 |
| 6,781,805 | B1 * | 8/2004 | Urakawa | 361/56 |
| 7,002,220 | B1 * | 2/2006 | Jin | H01L 23/66 257/355 |
| 7,825,715 | B1 * | 11/2010 | Greenberg | H03J 1/00 327/337 |
| 7,974,050 | B2 * | 7/2011 | Huang et al. | 361/56 |
| 8,331,073 | B2 * | 12/2012 | Chang | H01P 1/20 361/111 |
| 2004/0075964 | A1 * | 4/2004 | Ker et al. | 361/113 |
| 2010/0265622 | A1 * | 10/2010 | Campi et al. | 361/56 |
| 2011/0001542 | A1 * | 1/2011 | Ranta et al. | 327/382 |
| 2011/0002080 | A1 * | 1/2011 | Ranta | 361/277 |
| 2011/0127849 | A1 | 6/2011 | Yoon et al. | |
| 2013/0257558 | A1 * | 10/2013 | Kim | H03H 11/28 333/32 |
| 2013/0258535 | A1 * | 10/2013 | Kim et al. | 361/56 |
| 2014/0002208 | A1 * | 1/2014 | Kim et al. | 333/32 |

(Continued)

FOREIGN PATENT DOCUMENTS

| | | |
|---|---|---|
| JP | 2005-123426 A | 5/2005 |
| KR | 10-2011-0059516 A | 6/2011 |

(Continued)

OTHER PUBLICATIONS

Notice of Allowance issued in KR No. 10-2012-0034575; issued Nov. 13, 2013; 5 pages.

(Continued)

*Primary Examiner* — Thienvu Tran
*Assistant Examiner* — Angela Brooks
(74) *Attorney, Agent, or Firm* — Foley & Lardner LLP

(57) ABSTRACT

Disclosed is a tunable capacitor which includes: a variable capacitor unit placed between a first terminal and a second terminal; and an ESD protection circuit which is inserted either between the first terminal and a ground terminal or between the second terminal and the ground terminal, or is inserted both between the first terminal and a ground terminal and between the second terminal and the ground terminal.

17 Claims, 15 Drawing Sheets

(56) References Cited

U.S. PATENT DOCUMENTS

2014/0035631 A1* 2/2014 Choi et al. .................... 327/111
2014/0104132 A1* 4/2014 Bakalski et al. ............. 343/861

FOREIGN PATENT DOCUMENTS

WO  WO 2006/038190  A1   4/2006
WO  WO 2009/108391  A1   9/2009

OTHER PUBLICATIONS

Office Action issued in KR No. 10-2012-0034575; issued Jun. 28, 2013; 5 pages.
Extended European Search Report mailed Apr. 22, 2014 in related European Application No. 13161524.7 (6 pgs.).

* cited by examiner

PRIOR ART

TUNABLE CAPACITOR

BACKGROUND

1. Field

The present invention relates to a tunable capacitor, and more particularly to a tunable capacitor including an ESD protection circuit.

2. Description of Related Art

An electric potential difference rises due to static electricity collecting on a human body or a machine, and then the static electricity suddenly flows into a low electric potential point. This phenomenon is generally referred to as electrostatic discharge (ESD). The ESD has a high voltage of from several kV to several tens kV and is performed during a short period of time of several microseconds ($\mu s$).

An apparatus which can be affected by the ESD should include an ESD protection circuit in order to have a resistance to the ESD. For example, when a high voltage caused by the ESD is inputted through an antenna, the voltage caused by the ESD is much higher than an allowable voltage of a circuit element placed within a tunable capacitor for a matching network, the circuit placed within the tunable capacitor may be destroyed. Therefore, the ESD protection circuit should be included in order to lengthen the lifespan of the tunable capacitor and ensure the stable operations of the tunable capacitor.

FIG. 1 is a circuit diagram of a conventional ESD protection circuit.

Referring to FIG. 1, an ESD protection circuit 24 according to a conventional technology is implemented by connecting two diodes D1 and D2 branched off from an input/output (I/O) terminal between a ground line (GND) 14 and a power line 12 supplying power voltage VCC.

The ESD protection circuit 24 from the input/output (I/O) terminal is basically composed of the two diodes D1 and D2. That is, the cathode terminal of the first diode D1 is connected to the power voltage VCC and the anode terminal of the first diode D1 is connected to the input/output (I/O) terminal. The cathode terminal of the second diode D2 is connected to the input/output (I/O) terminal and the anode terminal of the second diode D2 is connected to the ground voltage GND. Under a normal operating condition, a discharge path of a pulse is not formed through each of the diodes D1 and D2. However, when an ESD pulse (hereafter, referred to as a positive ESD pulse) having a voltage level higher than a turn-on voltage of the first diode D1 is applied to the input/output (I/O) terminal, a discharge path of the ESD pulse is formed, which allows the positive ESD pulse to flow out from the input/output (I/O) terminal to the power voltage VCC. Contrary to this, when an ESD pulse (hereafter, referred to as a negative ESD pulse) having a voltage level lower than a turn-on voltage of the second diode D2 is applied to the input/output (I/O) terminal, a discharge path of the ESD pulse is formed, which allows the negative ESD pulse to flow out from the input/output (I/O) terminal to the ground voltage GND.

However, in the ESD protection circuit 24, since the diode operates in a breakdown region for a long time, the characteristics of the diode may be changed or damaged. Also, the diode is disadvantageous in miniaturizing electronic devices. When a swing signal having a large amplitude is applied as an input signal under a normal operating condition, the ESD protection circuit 24 has a problem of discharging the input signal.

Accordingly, recently, an ESD protection circuit including a field effect transistor (TEF) is being used in order to reduce an area required for the protection circuit and increase the reliability of static electricity prevention. However, when the swing signal having a large amplitude is applied, the reliability is not sufficient, for example, current leaks in the ESD protection circuit, and the like.

SUMMARY

One embodiment is a tunable capacitor which includes: a variable capacitor unit placed between a first terminal and a second terminal; and an ESD protection circuit which is inserted either between the first terminal and a ground terminal or between the second terminal and the ground terminal, or is inserted both between the first terminal and a ground terminal and between the second terminal and the ground terminal.

The ESD protection circuit may include a stacked transistor formed by connecting in series a plurality of MOS transistors.

The plurality of the MOS transistors may be formed by an N-type transistor, a P-type transistor or a combination of them.

The plurality of the MOS transistors may be comprised of n number of N-type transistors. A drain terminal of a first MOS transistor among the n number of transistors may be connected to the first terminal or the second terminal. A source terminal of a $n^{th}$ transistor is grounded. A low signal L or a negative voltage signal may be applied to either gate terminals or body terminals of the first to the $n^{th}$ transistors or may be applied to both the gate terminals and the body terminals of the first to the $n^{th}$ transistors.

The plurality of the MOS transistors may be comprised of n number of P-type transistors. A drain terminal of a first MOS transistor among the n number of transistors may be connected to the first terminal or the second terminal. A source terminal of a $n^{th}$ transistor is grounded. A high signal H may be applied to either gate terminals or body terminals of the first to the $n^{th}$ transistors or may be applied to both the gate terminals and the body terminals of the first to the $n^{th}$ transistors.

The gain terminal and the body terminal of the plurality of the MOS transistor may be connected in series to a resistance respectively.

The variable capacitor unit may include: a first capacitor; and a switching transistor which switches on/off the connection of the first capacitor between the first terminal and the second terminal.

When the switching transistor is in an on-state, a high signal H may be applied to a gate terminal G, and a low signal L may be applied to a body terminal B, a drain terminal D and a source terminal S. When the switching transistor is in an off-state, the low signal L may be applied to the gate terminal G and the body terminal B, and the high signal H may be applied to the drain terminal D and the source terminal S.

The switching transistor may be a stacked transistor formed by connecting in series a plurality of transistors.

A gate terminal G and a body terminal B of the switching transistor may be connected in series to a resistance respectively.

The first capacitor may be formed by connecting in series or in parallel a plurality of capacitors.

An on/off operation of the switching transistor may be performed by a high signal H and a low signal L.

The tunable capacitor may include a plurality of the variable capacitor units. The plurality of the variable capacitor units may be connected in parallel to each other. Each of the plurality of the variable capacitor units may include a first capacitor and a switching transistor which switches on/off the connection of the first capacitor between the first terminal and the second terminal.

An equivalent capacitance of the plurality of the variable capacitor units may be $2^{m-1}$ C1 (here, m is a natural number less than n). Width-to-length ratios W/L of the switching transistors of the plurality of the variable capacitor units may be $2^{m-1}$ W1 (here, m is a natural number less than n) respectively. The n may be a number of the variable capacitor units. The C1 may be an equivalent capacitance of a particular variable capacitor unit. The W1 may be a channel width-to-length ratio W/L of the switching transistor.

The tunable capacitor may further include a fixed capacitor which is connected in parallel to a plurality of the variable capacitor units.

The tunable capacitor may further include a controller which receives a digital control signal and controls on/off of the switching transistor.

An on/off operation of the switching transistor may be performed by a high signal H and a low signal L.

BRIEF DESCRIPTION OF THE DRAWINGS

FIG. 2b is a brief view showing an ESD protection circuit using the protection transistor shown in FIG. 2a;

DETAILED DESCRIPTION

Figure 1:
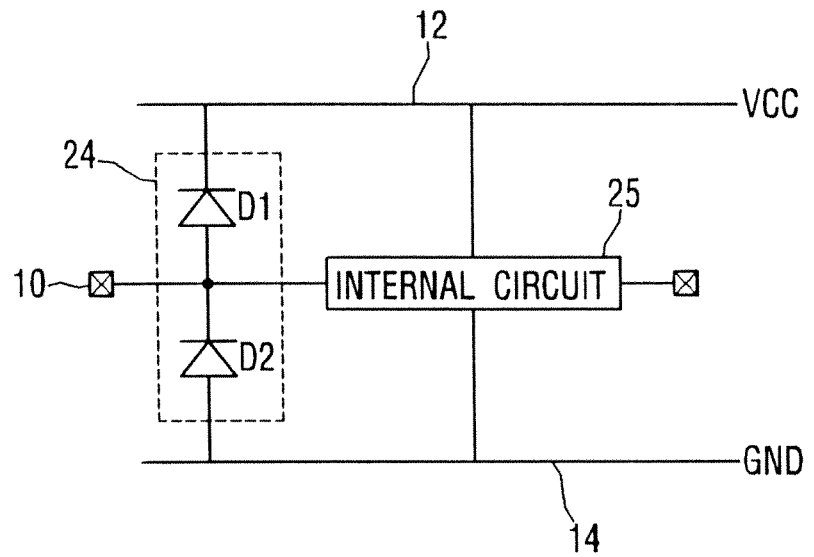
FIG. 1 is a brief view showing a conventional ESD protection circuit.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Therefore, the following detailed description is not intended to be limited. If adequately described, the scope of the present invention is limited only by the appended claims of the present invention as well as all equivalents thereto. Similar reference numerals in the drawings designate the same or similar functions in many aspects.

Prior to the description of a tunable capacitor according to an embodiment of the present invention, when it is assumed that a positive voltage applied to a transistor is VDD in a case where the transistor is an on-state with regard to a voltage signal applied to the transistor, it means that a high signal H has a voltage of about VDD/2 to VDD and a low signal L has a voltage of 0V (i.e., a ground signal) to about VDD/2. A standard for dividing the voltage signal applied to the transistor into the high signal H and the low signal L is not necessarily fixed. The standard may be changed according to an implementation environment of the tunable capacitor according to the embodiment of the present invention, for example, a magnitude of the applied positive voltage VDD or the characteristics of the transistor and the like.

Hereafter, a tunable capacitor according to a first embodiment of the present invention will be described with reference to the accompanying drawings.

An Exemplary Embodiment of the Present Invention

Prior to the description of an ESD protection circuit and a tunable capacitor including the ESD protection circuit according to the embodiment of the present invention, a principle of a typical ESD protection circuit using a transistor will be briefly described.

Figure 2A:
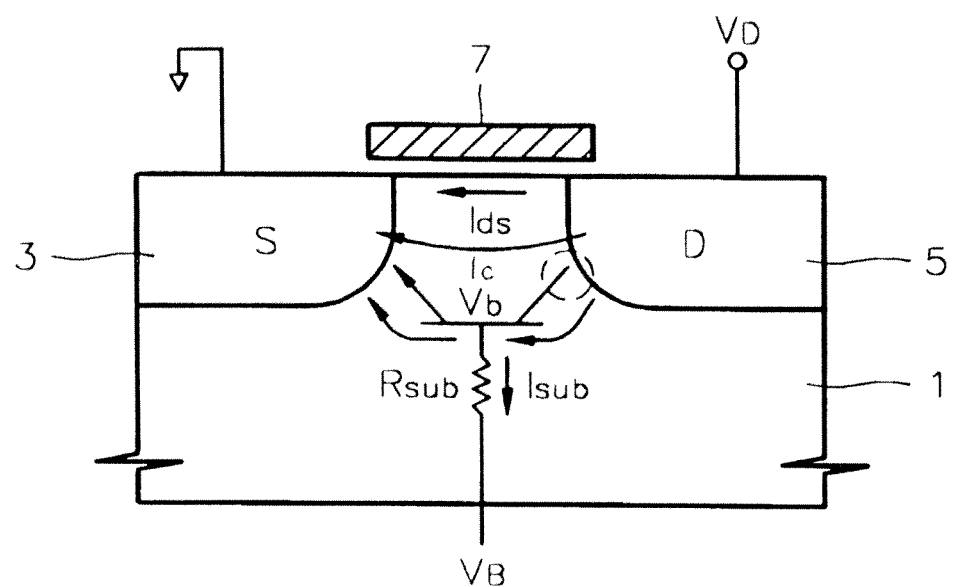
FIG. 2a is a cross sectional view showing an example of a protection transistor used in an ESD protection circuit.

FIG. 2a is a cross sectional view showing an example of a protection transistor used in the typical ESD protection circuit using FET.

Referring to FIG. 2a, reference numerals 1, 3, 5 and 7 represent a silicon substrate, a source, a drain and a gate.

As shown in FIG. 2a, a source 3, a silicon substrate 1 and a drain 5 of a typical protection transistor function as an emitter, base and a collector respectively of a parasitic bipolar transistor. Here, the typical protection transistor functions as a protection device by the operation of the parasitic bipolar transistor. That is, in the silicon substrate 1 of a MOS transistor used as the protection transistor, a current path other than a channel through which current flows from the drain 5 to the source 3 is formed by the parasitic bipolar transistor.

Such a current path is formed by turning on the parasitic bipolar transistor. For the purpose of turning on the parasitic bipolar transistor, an emitter-base junction, i.e., a source 3-silicon substrate 1 junction must be forward biased. For instance, when a substrate current corresponding to a base current of the parasitic bipolar transistor increases for a short time and then a turn-on time of the parasitic bipolar transistor is shortened, the efficiency of the ESD protection circuit is improved.

Figure 2B:
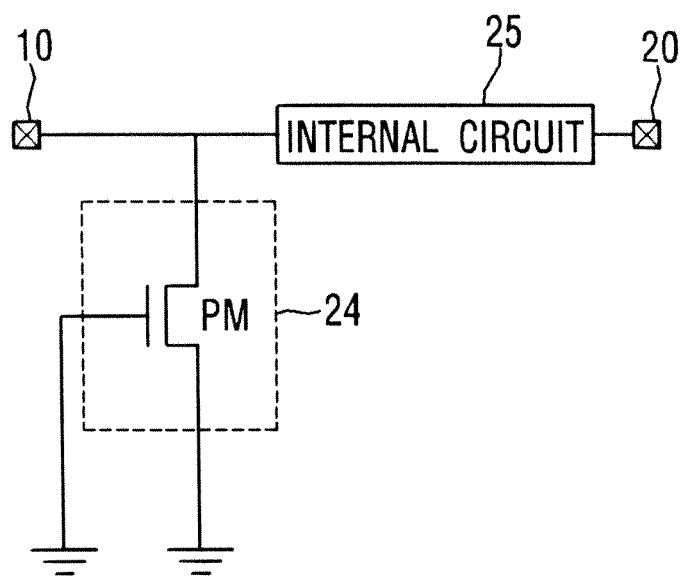

FIG. 2b is a brief view showing the typical ESD protection circuit using the protection device shown in FIG. 2a.

Referring to FIG. 2b, the ESD protection circuit 24 includes a protection transistor PM comprised of the MOS transistor. The drain terminal of the protection transistor PM is connected to an input terminal 10 and an internal circuit 25, and the source terminal and the gate terminal of the protection transistor PM are grounded. The ESD protection circuit 24 may be also connected to a ground terminal of an output terminal 20.

As shown in FIG. 2b, the ESD protection circuit 24 is in an off-state under a normal operating condition and does not affect the operation of the internal circuit 25. In other words, when a normal signal instead of an ESD pulse is inputted/outputted to the input/output terminals 10 and 20, a ground signal is applied to the gate terminal of the protection transistor PM, so that the protection transistor PM maintains a turn-off state. Therefore, the ESD protection circuit 24 does not affect the internal circuit 25.

However, the ESD pulse is inputted through the input/output terminals 10 and 20, a discharge path of the ESD pulse is, as described in FIG. 2a, formed by the parasitic bipolar transistor of the protection transistor PM.

Also, when a high voltage is applied to the ESD protection transistor PM, a high turn-on speed is obtained. However, a very large amount of leakage current is generated due to a parasitic bipolar junction transistor (BJT) and Darlington beta gain during the operation at a high temperature of the ESD protection transistor PM.

Besides, basically, the MOS transistor is a linear device. However, as the amplitude of the signal goes beyond a certain level depending on operating points, the MOS transistor shows non-linear characteristics. For example, a matching network used in an antenna, transmits/receives a signal of about 35 dBm. This signal has an amplitude of about 20 V. When such a signal is applied to or outputted from the input/output terminals 10 and 20, the ESD protection circuit 24 may be turned on, and then non-linear operations may hereby occur in the internal circuit 25.

Hereafter, an ESD protection circuit and a tunable capacitor including the ESD protection circuit in accordance with an embodiment of the present invention will be described.

Figure 3:
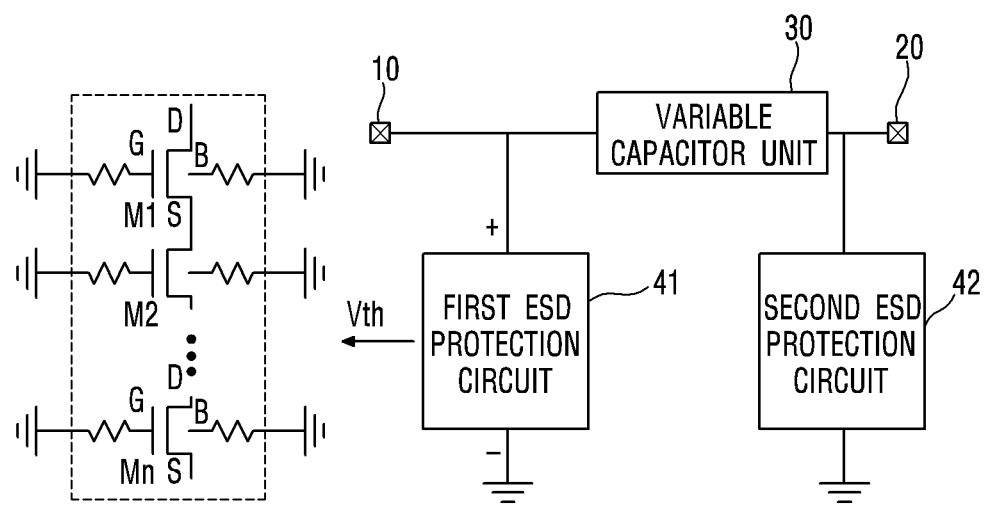
FIG. 3 is a circuit diagram showing a tunable capacitor including an ESD protection circuit according to an embodiment of the present invention.

FIG. 3 is a circuit diagram showing a tunable capacitor according to an embodiment of the present invention.

Referring to FIG. 3, the tunable capacitor according to the embodiment of the present invention includes a variable capacitor unit 30 formed by connecting in parallel a plurality of capacitors between a first terminal 10 and a second terminal 20, and a first ESD protection circuit 41 inserted between the first terminal 10 and a ground terminal. As shown in FIG. 3, for the purpose of the ESD protection at the output terminal 20, the tunable capacitor may further include a second ESD protection circuit 42 between the second terminal 20 and the ground terminal.

The first terminal 10 may be a load line unit connected to a load. The second terminal 20 may be a ground terminal connected to the ground. For another example, the first terminal 10 may be an RF+ terminal connected to an RF input port. The second terminal 20 may be an RF− terminal connected to an RF output port. Besides, the first and the second terminals 10 and 20 may be used as a terminal having another form by a person having ordinary skill in the art.

As shown in FIG. 3, the first ESD protection circuit 41 may include a plurality of the MOS transistors. The plurality of the MOS transistors may form a stacked transistor, of which the drain terminal and the source terminal are connected to each other.

The MOS transistor may be formed by an N-type transistor, a P-type transistor or a combination of them. The N-type transistor is taken as an example in the embodiment.

The drain terminal of a first transistor, i.e., a transistor M1 is connected to the first terminal 10, and the source terminal of the transistor M1 is connected to the drain terminal of a second transistor, i.e., a transistor M2. Similarly, the source terminal of the transistor M2 is connected to the drain terminal of a transistor M3. In this manner, the drain terminal of the last transistor, i.e., a transistor Mn is connected to the source terminal of a transistor Mn-1, and the source terminal of the transistor Mn is connected to the ground terminal GND. The gate terminals and the body terminals of respective MOS transistors M1 to Mn may be connected to the ground terminal GND, or a negative voltage signal may be inputted to the gate terminals and the body terminals of respective MOS transistors M1 to Mn. Also, a resistance may be inserted between the gate terminal and the ground terminal GND or between the body terminal and the ground terminal GND of each of the MOS transistors M1 to Mn. Meanwhile, in a case where the MOS transistor included in the stacked transistor is the P-type transistor, when a high signal H is applied to the gate terminal and the body terminal of each P-type transistor, the MOS transistor is able to perform the same function as that of the stacked transistor comprised of the N-type transistor. Here, a resistance may be connected to the gate terminal and the body terminal.

According to the embodiment of the present invention, the first ESD protection circuit 41 is able to maintain a turn-off state under the normal operating condition that the ESD pulse is not applied. When a voltage (Vth) between both ends of stacked transistor of the first ESD protection circuit 41 is higher than or equal to a voltage applied to the first terminal 10, the first ESD protection circuit 41 maintains the turn-off state. The voltage (Vth) between both ends of stacked transistor is proportional to a sum of threshold voltages of the respective MOS transistors included in the stacked transistor. Accordingly, even though the amplitude of the input signal changes, the number of the MOS transistors included in the stacked transistor is determined, so that it is possible to control the first ESD protection circuit 41 to maintain the turn-off state under the normal operating condition.

That is to say, the stacked transistor is inserted as the first ESD protection circuit 41 between the first terminal 10 and the ground terminal, leakage current through the first ESD protection circuit 41 can be reduced. Also, the magnitude of the voltage assigned to one MOS transistor can be reduced by stacking a plurality of the transistors. By doing this, it is possible to prevent that a non-linear component is generated at the time of applying an input signal having a large amplitude. Accordingly, the first ESD protection circuit 41 protects the internal circuit from the ESD pulse signal, is not turned on even if a high voltage signal is inputted as an input signal, and does not affect the operation of the internal circuit. As a result, the first ESD protection circuit 41 is able to stably perform the function of the ESD protection circuit.

Since the configuration and function of the second ESD protection circuit 42 is the same as those of the first ESD protection circuit 41, a detailed description thereof will be omitted.

Figure 4:
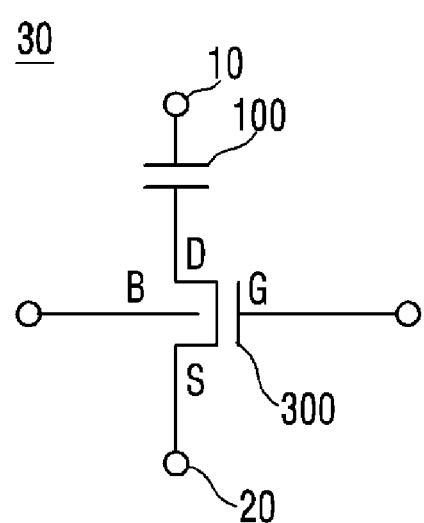
FIG. 4 is a circuit diagram showing a tunable capacitor according to the embodiment of the present invention.

FIG. 4 shows an implementation example of the variable capacitor unit according to the embodiment of the present invention.

As shown in FIG. 4, one and the other ends of the variable capacitor unit 30 are connected to the first terminal 10 and the second terminal 20 respectively. The variable capacitor unit 30 is able to control capacitance in accordance with an external control signal. For example, the variable capacitor unit 30 according to the embodiment of the present invention may include at least one capacitor which is connected in series or in parallel thereto, and then a corresponding capacitor is selected according to the external control signal. However, the variable capacitor unit 30 according to the embodiment of the present invention is not necessarily limited to this. Any structure capable of controlling the capacitance can be included in the variable capacitor unit 30 of the present invention. A concrete implementation example of the variable capacitor unit 30 will be described later in detail.

Hereafter, a concrete implementation example of the variable capacitor unit 30 will be described.

FIG. 4 shows the variable capacitor unit according to an embodiment of the present invention.

Referring to FIG. 4, the variable capacitor unit 30 according to the embodiment of the present invention includes a first capacitor 100 placed between the first terminal 10 and the second terminal 20, and a switching transistor 300 which connects/disconnects the connection of the first capacitor 100 between the first terminal 10 and the second terminal 20.

Specifically, one and the other ends of the first capacitor 100 of the variable capacitor unit 30 according to the embodiment of the present invention are connected to the first terminal 10 and the switching transistor 300 respectively. One and the other end of the switching transistor 300 are connected to the first capacitor 100 and the second terminal 20 respectively.

The switching transistor 300 receives a control signal and controls the on/off of the variable capacitor unit 30 corresponding to the control signal. In other words, the corresponding variable capacitor unit 30 may or may not be selected between the first terminal 10 and the second terminal 20. A variety of semiconductor devices may be used as the switching transistor 300.

Figure 5A:
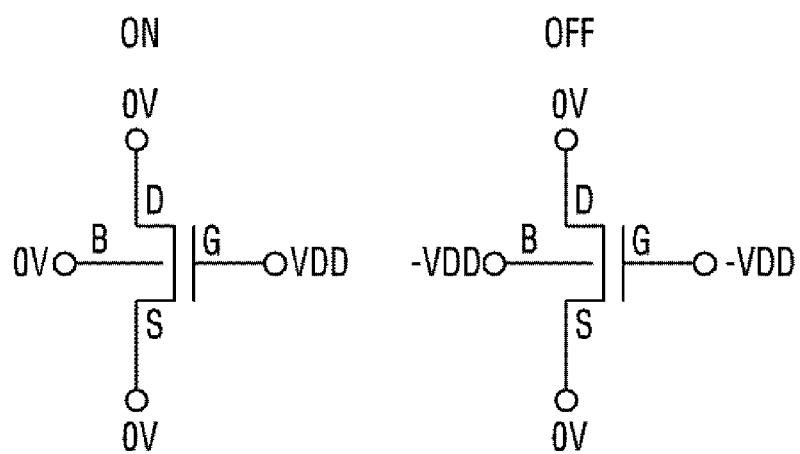
FIG. 5a is a brief view showing a variable capacitor unit which uses a negative voltage.

FIG. 5a shows the operation of the variable capacitor unit 30 using a negative voltage.

As shown in FIG. 5a, for the purpose of the on/off operation of the switching transistor, when the switching transistor is in the on-state, a gate-source voltage (VGS) and a gate-drain voltage (VGD) are positive voltages VDD, and a body-source voltage (VBS) and a body-drain voltage (VBD) are 0V. Contrary to this, when the switching transistor is in the off-state, the gate-source voltage (VGS) and the gate-drain voltage (VGD) are negative voltages −VDD, and the body-source voltage (VBS) and the body-drain voltage (VBD) are also negative voltages −VDD. This intends to improve high power handling capability and linearity of the variable capacitor unit 30.

Specifically, when the switching transistor is in the on-state, a signal of 0V (GND) is applied to a drain terminal D, a source terminal S and a body terminal B of the switching transistor, and a signal of the positive voltage VDD is applied to a gate terminal G. Contrary to this, when the switching transistor is in the off-state, the signal of 0V (GND) is applied to the drain terminal D and the source terminal S, and a signal of the negative voltage −VDD is applied to the gate terminal G and the body terminal B. That is, the gate-source voltage (VGS) and the gate-drain voltage (VGD) have a negative value. Therefore, the signal of the negative voltage −VDD is transmitted for the purpose of the on/off operation of the switching transistor 300.

Hereafter, the operation of the switching transistor 300 of the variable capacitor unit 30 according to the embodiment of the present invention will be described in detail.

FIG. 5 shows the on/off state of the switching transistor of the variable capacitor unit which does not use the negative voltage.

Figure 5B:
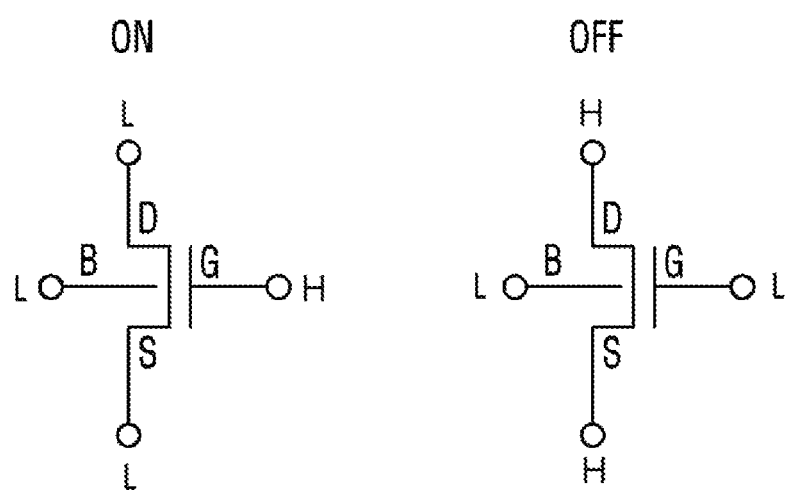
FIG. 5b is a brief view showing a variable capacitor unit which does not use the negative voltage.

Referring to FIG. 5b, in the switching transistor 300 of the variable capacitor unit 30 according to the embodiment of the present invention, the drain terminal D may be connected to the first capacitor 100, and the source terminal S may be connected to the second terminal 20. The switching transistor 300 functions to switch on/off the first capacitor 100. Due to the characteristics of the transistor, the switching transistor 300 may be reversely connected between the first terminal 10 and the second terminal 20. That is, the source terminal S of the switching transistor 300 may be connected to the first capacitor 100, and the drain terminal D may be connected to the second terminal 20. For convenience of description in the embodiment of the present invention, a case where the drain terminal D of the switching transistor 300 is connected to the first capacitor 100 will be taken as an example for description.

First, when the switching transistor 300 is in the on-state, the high signal H is applied to the gate terminal G, and the low signal L is applied to the drain terminal D, the source terminal S and the body terminal B. However, when the switching transistor 300 is in the off-state, the low signal L is applied to the gate terminal G and the body terminal B of the switching transistor 300, and the high signal H is applied to the drain terminal D and the source terminal S.

The operation of the switching transistor 300 according to the embodiment of the present invention is determined by the gate-drain voltage (VGD) of an electric potential difference between the gate terminal G and the drain terminal D, the gate-source voltage (VGS) of an electric potential difference between the gate terminal G and the source terminal S, the body-drain voltage (VBD) of an electric potential difference between the body terminal B and the drain terminal D, and the body-source voltage (VBS) of an electric potential difference between the body terminal B and the source terminal S.

Referring to FIGS. 4 to 5b, when the switching transistor which uses the negative voltage and the switching transistor 300 which does not use the negative voltage are in the on-state, voltages applied to the respective terminals are the same as each other, and thus the operations of them are also the same as each other. On the contrary to this, when they are in the off-state, voltages applied to the respective terminals are different from each other. However, when they are in the off-state, the gate-drain voltage (VGD) and the gate-source voltage (VGS) are the same as the negative value of −VDD, and the body-drain voltage (VBD) and the body-source voltage (VBS) are the same as the negative value of −VDD. Consequently, the operations of the two switching transistors are the same as each other.

In other words, regarding the variable capacitor unit 30 of the tunable capacitor 1, despite the fact that the voltages applied to the respective terminals of the switching transistor 300 which does not use the negative voltage are different from the voltages applied to the respective terminals of the switching transistor which uses the negative voltage, the electric potential differences between the respective terminals are the same as each other, so that the two switching transistors perform the same operation. Accordingly, the tunable capacitor 1 according to the embodiment of the present invention shown in FIG. 5b does not use the negative voltage and is able to maintain the same power handling capability and linearity as those of the tunable capacitor using the negative voltage.

Therefore, the tunable capacitor 1 according to the embodiment of the present invention may include the variable capacitor unit using the negative voltage. However, it is recommended that the tunable capacitor 1 should include the variable capacitor unit 30 which has excellent power handling capability and linearity and does not use the negative voltage.

Figure 6:
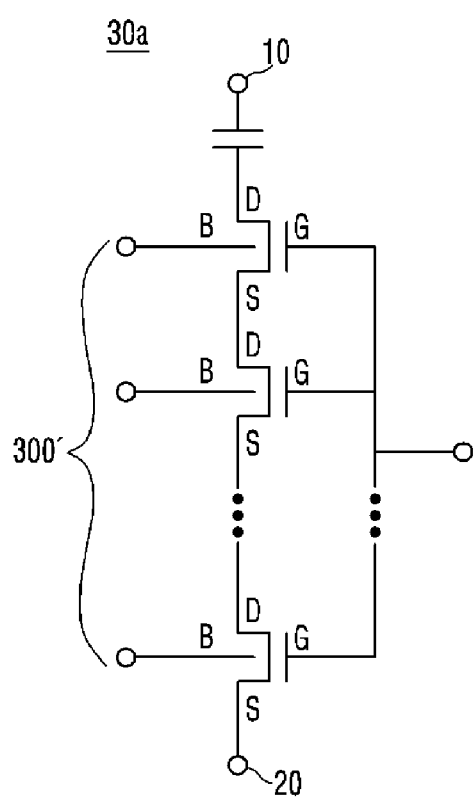
FIG. 6 is a circuit diagram showing a variable capacitor unit according to another embodiment of the present invention.

FIG. 6 shows a variable capacitor unit according to another embodiment of the present invention.

Referring to FIG. 6, a switching transistor 300' of the variable capacitor unit 30a may be formed to have a structure in which the plurality of transistors are in series connected. To use a stacked transistor formed by connecting in series the plurality of the transistors instead of a single transistor is advantageous in improving the power handling capability and linearity of the tunable capacitor. Control signals applied to the respective transistors are the same as each other and the on/off operations of the respective transistors are performed in the same manner. Since the stacked transistor is a publicly known art, a detailed description thereof will be omitted.

Figure 7:
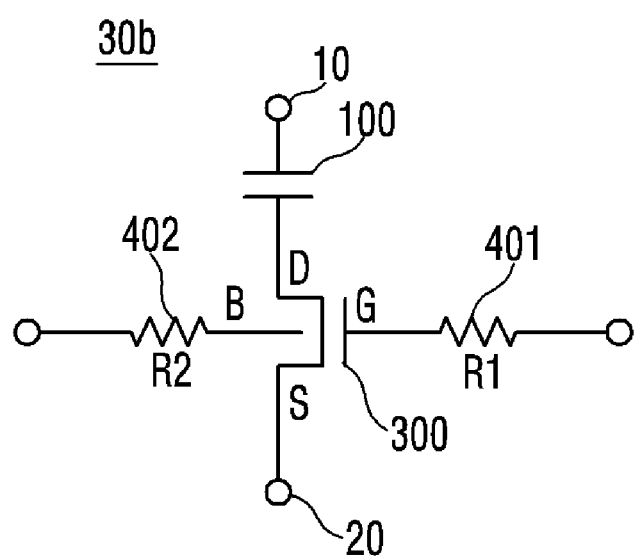
FIG. 7 is a circuit diagram showing a variable capacitor unit according to further another embodiment of the present invention.

FIG. 7 shows the variable capacitor unit according to further another embodiment of the present invention.

Referring to FIG. 7, a gate terminal G and a body terminal B of the switching transistor 300 may be connected to a first resistance 401 and a second resistance 402 respectively.

As shown in FIG. 7, the gate terminal G of the switching transistor 300 of a variable capacitor unit 30b may be connected to the first resistance (R1) 401 and the body terminal B may be connected to the second resistance (R2) 402. Even though a signal having a large amplitude is applied to the drain terminal and the source terminal when the switching transistor 300 becomes in the on-state, the first resistance (R1) 401 connected to the gate terminal G and the second resistance (R2) 402 intend to cause the switching transistor 300 to be always in the on-state without being turned off. That is, it is possible to prevent the switching transistor 300 from being in the off-state during the process of swinging an inputted on-signal. Similarly, when an off-signal is inputted, the switching transistor 300 can be prevented from being in the on-state.

Figure 8:
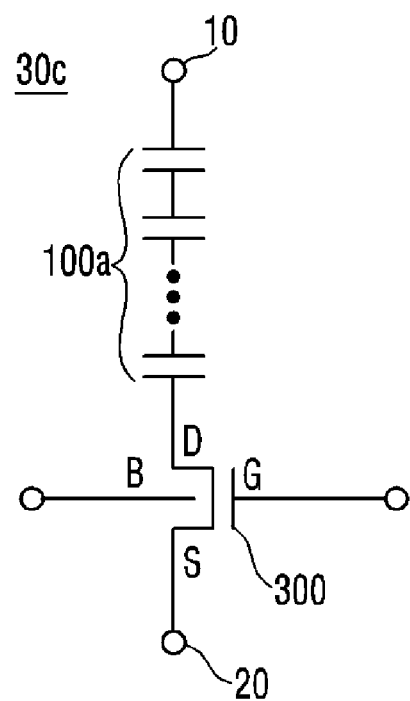
FIG. 8 is a circuit diagram showing a variable capacitor unit according to yet another embodiment of the present invention.

FIG. 8 shows a variable capacitor unit according to yet another embodiment of the present invention.

Referring to FIG. 8, a first capacitor 100a has a stacked structure formed by connecting in series the plurality of capacitors.

As shown in FIG. 8, a first capacitor 100a of a variable capacitor unit 30c may be a stacked capacitor obtained by connecting in series the capacitors. This intends to enhance an effective breakdown voltage of the capacitor. The variable capacitor unit 30c according to the embodiment of the present invention may be used in a smaller and lighter electronic device and the like. Also, the variable capacitor unit 30c is advantageous for processing a radio frequency signal.

Figure 9:
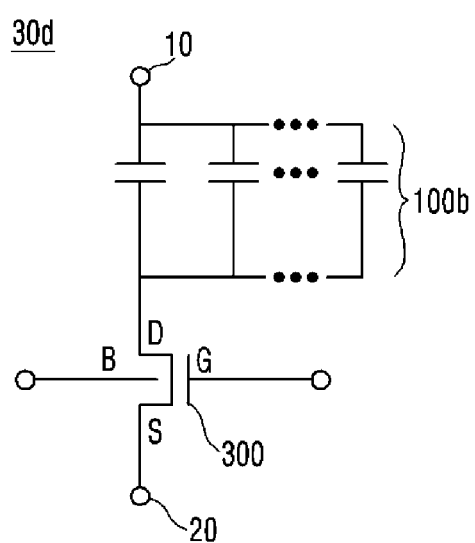
FIG. 9 is a circuit diagram showing a variable capacitor unit according to still another embodiment of the present invention.

FIG. 9 shows a variable capacitor unit according to still another embodiment of the present invention.

Referring to FIG. 9, a first capacitor 100b of a variable capacitor unit 30d has a structure formed by connecting in parallel the plurality of capacitors As shown in FIG. 9, the first capacitor 100b can be implemented by connecting in parallel the plurality of the capacitors. Since the capacitance of the first capacitor 100b is increased due to the parallel connection of the capacitors, a tunable capacitor having a large capacitance can be created.

As such, the variable capacitor unit 30 according to the embodiment of the present invention includes the first capacitor 100 and the switching transistor 300. The variable capacitor units 30a and 30b can be implemented by using the stacked transistor as the switching transistor 300 of the variable capacitor unit 30 or by connecting resistances to the gate terminal G and the body terminal B. The variable capacitor units 30c and 30d can be implemented by stacking the first capacitors 100 or by connecting in parallel a plurality of the first capacitors 100.

Figure 10A:
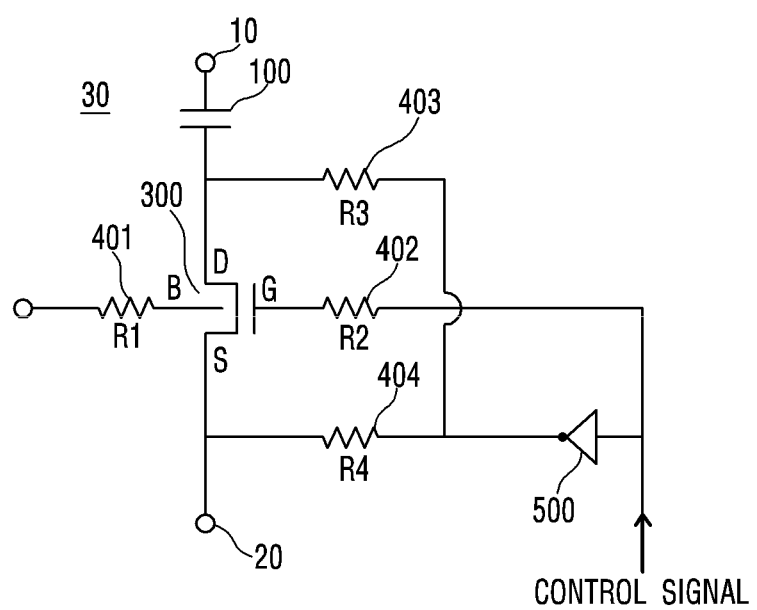
FIG. 10a is a circuit diagram showing the variable capacitor unit according to an embodiment of the present invention.
Figure 10B:
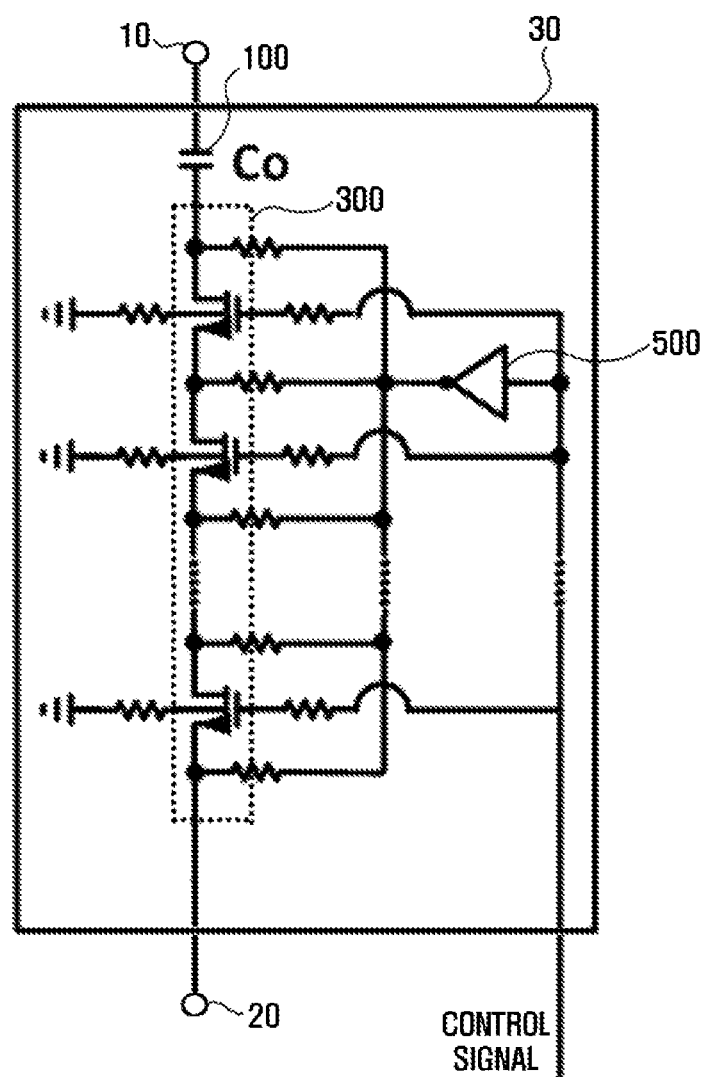
FIG. 10b is a circuit diagram showing the implemented variable capacitor unit.

FIG. 10a is a brief view showing the variable capacitor unit 30 according to the embodiment of the present invention. FIG. 10b is a circuit diagram showing the concretely implemented variable capacitor unit 30.

Referring to FIG. 10a, the variable capacitor unit 30 according to the embodiment of the present invention includes the first capacitor 100 placed between the first terminal 10 and the second terminal 20, and the switching transistor 300 which connects/disconnects the connection of the first capacitor 100 between the first terminal 10 and the second terminal 20.

The on/off operation of the switching transistor 300 of the variable capacitor unit 30 according to the embodiment of the present invention is performed by the low signal L and the high signal H without using the negative voltage. The signal applied to the gate terminal G of the switching transistor 300 is converted, and then the converted signal is applied to the drain terminal D and the source terminal S of the switching transistor 300.

Specifically, one and the other ends of the first capacitor 100 of the variable capacitor unit 30 according to the embodiment of the present invention are connected to the first terminal 10 and the switching transistor 300 respectively. One and the other end of the switching transistor 300 are connected to the first capacitor 100 and the second terminal 20 respectively.

The on/off operation of the switching transistor 300 of the variable capacitor unit 30 according to the embodiment of the present invention is performed by the ground signal and a positive voltage signal. For this, the variable capacitor unit 30 may further include a converter 500 which generates a control signal applied to the drain terminal D and the source terminal S of the switching transistor 300. The converter 500 converts an input signal applied to the gate terminal G of the switching transistor 300 and applies the converted signal to the drain terminal D and the source terminal S of the switching transistor 300. A resistance may be connected in series to the body terminal B and the gate terminal G of the switching transistor 300. A third resistance (R3) 403 and a fourth resistance (R4) 404 may be inserted between the converter 500 and both of the drain terminal D and the source terminal S. The third resistance (R3) 403 and the fourth resistance (R4) 404 are able to prevent signal loss of the converter.

As shown in FIG. 10a, the converter 500 converts the voltage respectively applied to the drain terminal D and the source terminal S of the switching transistor 300 and causes the voltage to be opposite to the voltage applied to the gate terminal G. An inverter, etc., capable of converting the inputted control signal may be used as the converter 500.

Hereafter, in the variable capacitor unit 30 of the tunable capacitor 1, a method for controlling the on/off operation of the first capacitor 100 by the voltage applied to the switching transistor 300 by the converter 500 will be described.

First, the operation in the on-state will be described. An external control signal is applied to the respective gate terminals G of the switching transistor 300. Also, the control signal is converted by the converter 500 and may be applied to the drain terminal D and the source terminal S of the switching transistor 300. In other words, when the control signal is in the on-state, the high signal H is applied to the gate terminal G of the switching transistor 300 and the low signal L is applied to the drain terminal D and the source terminal S. Therefore, the gate-source voltage (VGS) and the gate-drain voltage (VGD) have a positive value, so that the switching transistor 300 becomes in the on-state. Accordingly, the first capacitor 100 is selected between the first terminal 10 and the second terminal 20.

Next, the operation in the off-state will be described. An off-signal is applied as a control signal from the outside, the low signal L is applied to the gate terminal G of the switching transistor 300 and the high signal H is applied to the drain terminal D and the source terminal S. Here, since the gate-source voltage (VGS) and the gate-drain voltage (VGD) have a negative value, the switching transistor 300 becomes in the off-state and performs an open operation between the first terminal 10 and the second terminal 20, so that the corresponding variable capacitor unit is not selected.

According to the embodiment of the present invention, the low signal L is applied to the body terminal B in an on/off state of the on/off switching transistor 300.

FIG. 10b is a circuit diagram showing the actually implemented variable capacitor unit of FIG. 10a. FIG. 10b also shows an example in which the switching transistor 300 is implemented by the stacked transistor.

As such, according to the embodiment of the present invention, it is possible to on/off control the switching transistor 300 only by the positive voltage signal VDD and the negative voltage signal is not required. Therefore, there is an effect that a negative voltage generating circuit which has cost and efficiency disadvantages is not necessarily implemented.

Next, the variable capacitor unit formed by connecting in parallel a plurality of the variable capacitors will be described.

Figure 11:
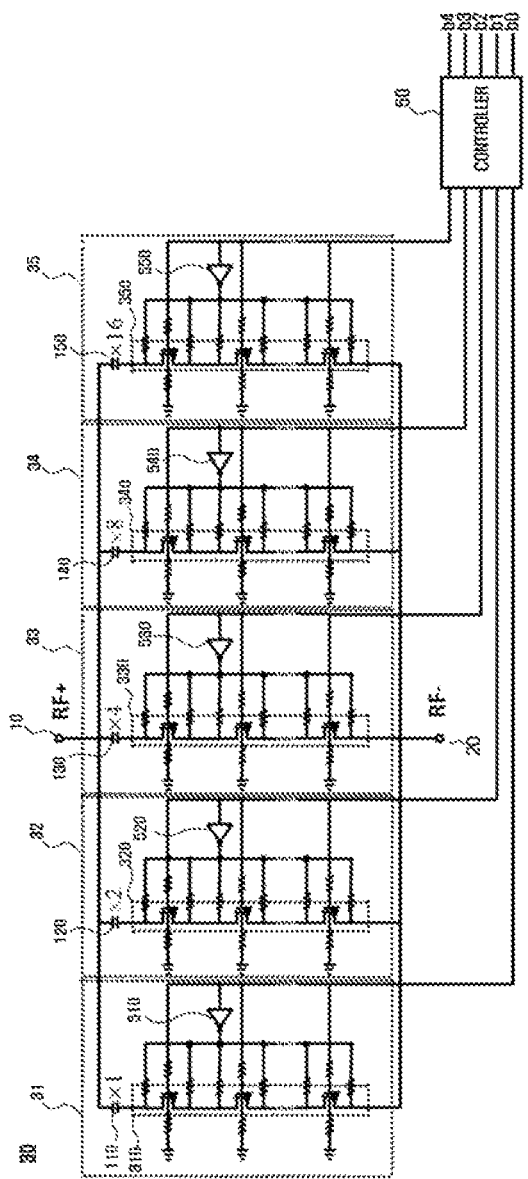
FIG. 11 is a circuit diagram showing a variable capacitor unit according to an embodiment of the present invention.

FIG. 11 is a circuit diagram showing the variable capacitor unit 30 according to an embodiment of the present invention.

Referring to FIG. 11, the variable capacitor unit 30 according to the embodiment of the present invention may include a plurality of variable capacitors 31, 32, 33, 34 and 35 which are connected in parallel to each other and are placed between the first terminal 10 and the second terminal 20. The variable capacitor unit 30 may further include a controller 50 controlling the variable capacitor unit 30.

In the embodiment of the present invention, although the variable capacitor unit including five variable capacitors will be described for convenience of description, the number of the variable capacitors connected in parallel may be changed according to the variation range to be implemented of the variable capacitor unit. In the embodiment, the first terminal 10 may function as an RF+ terminal and the second terminal 20 may function as an RF− terminal.

The variable capacitors 31, 32, 33, 34 and 35 include first capacitors 110, 120, 130, 140 and 150 and switching transistors 310, 320, 330, 340 and 350 respectively.

As shown in FIG. 11, capacitances of the first capacitors 110, 120, 130, 140 and 150 of the variable capacitors 31, 32, 33, 34 and 35, channel width-to-length ratios W/L of the switching transistors 310, 320, 330, 340 and 350, gate resistances and body resistances may be set as mutually different values.

For this purpose, a weight may be applied to the capacitances of the first capacitors 110, 120, 130, 140 and 150, the channel width-to-length ratios W/L of the switching transistors 310, 320, 330, 340 and 350, the gate resistances and the body resistances.

For example, when the first variable capacitor 31 shown in FIG. 11 is a least significant capacitor (LSC) having the minimum weight, the weight of the next variable capacitor 32 may be set twice as much as that of the least significant capacitor (LSC) 31. When the weight becomes twice, the capacitance of the first capacitor 120, and the channel width-to-length ratios W/L of the switching transistor 320 become twice as much as the capacitance of the first capacitor 110 of the least significant capacitor (LSC) 31, and the channel width-to-length ratios W/L of the switching transistor 310 respectively.

Similarly, the weight of the next variable capacitor 33 may be set four times as much as that of the least significant capacitor (LSC) 31. In this manner, the fifth variable capacitor 35, i.e., the last variable capacitor corresponds to a most significant capacitor (MSC) having the maximum weight. The weight becomes 16 times (=$2^{(5-1)}$). Therefore, if the number of the variable capacitors is n, the weights of the respective variable capacitors 31, 32, 33, 34 and 35 may become $2^{(m-1)}$ (here, m is a natural number less than n).

For example, among output signals of the controller 50, when only the control signal inputted to the least significant capacitor (LSC) 31 is the high signal H and the control signals transmitted to the other variable capacitors 32, 33, 34 and 35 are the low signal L, the high signal H is applied to the gate terminal G of the switching transistor 310 of the least significant capacitor (LSC) 31, and the high signal H of the controller 50 is converted into the low signal L by a converter 510 and is applied to the drain terminal D and the source terminal S. Accordingly, the switching transistor 310 of the least significant capacitor (LSC) 31 becomes in the on-state. However, the switching transistors 320, 330, 340 and 350 of the other variable capacitors 32, 33, 34 and 35 become in the off-state. Therefore, the capacitance between the first terminal 10 and the second terminal 20 is varied to the capacitance of the first capacitor 110.

Therefore, if the capacitance of the least significant capacitor (LSC) 31 is 1 pF, the capacitance of the variable capacitor unit 30 may be variable from minimally 1 pF to maximally 31 pF.

Meanwhile, when the variable capacitor unit 30 is controlled by the controller 50, digital control signals b0, b1, b2, b3 and b4 are applied to the controller 50, and then the controller 50 may output a control signal corresponding to the digital control signals. Here, the variable capacitor unit 30 is able to perform a 5-bit digital control. In other words, as the digital control signals b0, b1, b2, b3 and b4 are changed into the low signal or the high signal, the respective switching transistors 310, 320, 330, 340 and 350 are on/off controlled, so that the tuning may be digitally performed. Therefore, when the number of the variable capacitors is n, the variable capacitor unit 30 is capable of performing n-bit digital tuning operation.

Figure 12:
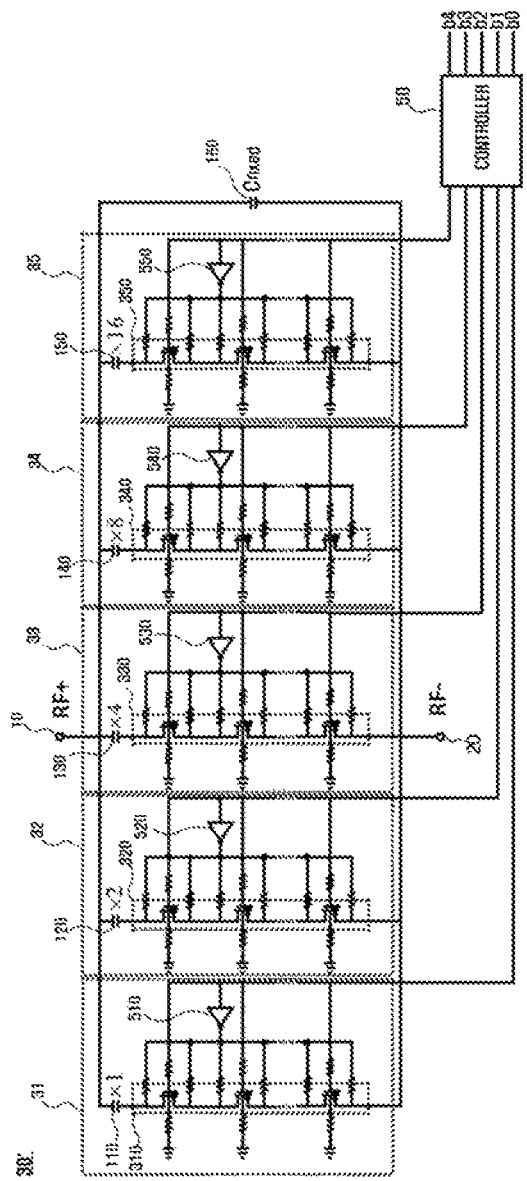
FIG. 12 is a circuit diagram showing a variable capacitor unit according to another embodiment of the present invention.

FIG. 12 shows a variable capacitor unit 30' unit according to another embodiment of the present invention.

Referring to FIG. 12, the variable capacitor unit 30' according to the embodiment of the present invention may further include a fixed capacitor (Cfixed) 160 added in parallel to the variable capacitors 31, 32, 33, 34 and 35 which are connected in parallel to each other.

As shown in FIG. 12, even if none of the tunable capacitors 31, 32, 33, 34 and 35 which are connected in parallel to each other are selected, that is to say, even though all of the switching transistors 310, 320, 330, 340 and 350 become in the off-state, the capacitor between the first terminal 10 and the second terminal 20 may correspond to the fixed capacitor (Cfixed) 160.

As described above, according to the embodiment of the present invention, the ESD protection circuit including the stacked transistor does not operate under the normal operating condition that the ESD pulse voltage is not applied from the outside and functions as a path bypassing the current only when the ESD pulse voltage is applied. That is, the ESD protection circuit according to the embodiment of the present invention is turned off under the normal operating condition and is turned on only when the ESD pulse voltage is applied, so that, under the normal operating condition, undesired leakage current can be prevented from being generated. Further, the magnitude of the voltage assigned to one MOS transistor is reduced, and thus, a non-linear component can be prevented from being generated. Accordingly, even when an input signal having a large amplitude is applied, it is possible to stably perform the function of the ESD protection circuit.

Meanwhile, as described above, the voltage applied to the gate terminal G of the switching transistor is converted and then is applied to the source terminal S and the drain terminal D, so that it is possible to control the on/off of the switching transistor without generating a separate negative voltage. In other words, a response becomes faster and more accurate and the negative voltage is not used, and thus a negative voltage generator is not required. Accordingly, it is possible to overcome problems caused by the negative voltage generator, for example, sensitivity degradation, power consumption, space utilization and the like.

The features, structures and effects and the like described in the embodiments are included in at least one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A tunable capacitor, comprising:
   a variable capacitor unit connected between a first terminal and a second terminal and including:
   a first capacitor having one terminal and another terminal, the one terminal being connected to the first terminal, and
   a switching transistor connected to the another terminal of the first capacitor and configured to switch on/off the connection of the first capacitor between the first terminal and the second terminal; and
   an ESD protection circuit including a stacked transistor formed by connecting in series a plurality of MOS transistors, wherein
   a signal is applied to either a gate terminal or a body terminal of each of the plurality of MOS transistors or to both the gate terminal and the body terminal of each MOS transistor, such that each MOS transistor maintains a turn-off state, and
   one of the plurality of MOS transistors is directly connected to the one terminal of the first capacitor.

2. The tunable capacitor of claim 1, wherein the plurality of the MOS transistors include an N-type transistor, a P-type transistor or a combination of them.

3. The tunable capacitor of claim 1, wherein the plurality of the MOS transistors are comprised of n number of N-type transistors, wherein a drain terminal of a first MOS transistor among the n number of transistors is connected to the first terminal or the second terminal, wherein a source terminal of a $n^{th}$ transistor is grounded, and wherein a low signal L or a negative voltage signal is applied to either gate terminals or body terminals of the first to the $n^{th}$ transistors or is applied to both the gate terminals and the body terminals of the first to the $n^{th}$ transistors.

4. The tunable capacitor of claim 3, wherein the gain terminal and the body terminal of the plurality of the MOS transistor are connected in series to a resistance respectively.

5. The tunable capacitor of claim 1, wherein the plurality of the MOS transistors are comprised of n number of P-type transistors, wherein a drain terminal of a first MOS transistor among the n number of transistors is connected to the first terminal or the second terminal, wherein a source terminal of a $n^{th}$ transistor is grounded, and wherein a high signal H is applied to either gate terminals or body terminals of the first to the $n^{th}$ transistors or is applied to both the gate terminals and the body terminals of the first to the $n^{th}$ transistors.

6. The tunable capacitor of claim 5, wherein the gain terminal and the body terminal of the plurality of the MOS transistor are connected in series to a resistance respectively.

7. The tunable capacitor of claim 1, wherein when the switching transistor is in an on-state, a high signal H is applied to a gate terminal G, and a low signal L is applied to a body terminal B, a drain terminal D and a source terminal S, and wherein when the switching transistor is in an off-state, the low signal L is applied to the gate terminal G and the body terminal B, and the high signal H is applied to the drain terminal D and the source terminal S.

8. The tunable capacitor of claim 1, wherein the switching transistor is a stacked transistor formed by connecting in series a plurality of transistors.

9. The tunable capacitor of claim 1, wherein a gate terminal G and a body terminal B of the switching transistor are connected in series to a resistance respectively.

10. The tunable capacitor of claim 1, wherein the first capacitor is formed by connecting in series or in parallel a plurality of capacitors.

11. The tunable capacitor of claim 1, wherein an on/off operation of the switching transistor is performed by a high signal H and a low signal L.

12. The tunable capacitor of any one claim of claim 1, comprising a plurality of the variable capacitor units, wherein the plurality of the variable capacitor units are connected in parallel to each other, wherein each of the plurality of the variable capacitor units comprises a first capacitor and a switching transistor which switches on/off the connection of the first capacitor between the first terminal and the second terminal.

13. The tunable capacitor of claim 12, further comprising a fixed capacitor which is connected in parallel to a plurality of the variable capacitor units.

14. The tunable capacitor of claim 12, further comprising a controller which receives a digital control signal and controls on/off of the switching transistor.

15. The tunable capacitor of claim 12, wherein an on/off operation of the switching transistor is performed by a high signal H and a low signal L.

16. A tunable capacitor, comprising:
   a variable capacitor unit connected between a first terminal and a second terminal;
   an ESD protection circuit connected either between the first terminal and a ground terminal or between the second terminal and the ground terminal, or connected both between the first terminal and a ground terminal and between the second terminal and the ground terminal; and a plurality of the variable capacitor units, wherein:

the plurality of the variable capacitor units are connected in parallel to each other, wherein each of the plurality of the variable capacitor units comprises a first capacitor and a switching transistor which switches on/off the connection of the first capacitor between the first terminal and the second terminal, the ESD protection circuit comprises a stacked transistor formed by connecting in series a plurality of MOS transistors, a signal is applied to either a gate terminal or a body terminal of each of the plurality of MOS transistors or to both the gate terminal and the body terminal of each MOS transistor, such that each MOS transistor maintains a turn-off state, and an equivalent capacitance of the plurality of the variable capacitor units is $2^{m-1} \times C1$ (here, m is a natural number less than n), wherein width-to-length ratios W/L of the switching transistors of the plurality of the variable capacitor units are $2^{m-1} \times W1$ (here, m is a natural number less than n) respectively, and wherein the n is a number of the variable capacitor units, wherein the C1 is an equivalent capacitance of a particular variable capacitor unit, and wherein the W1 is a channel width-to-length ratio W/L of the switching transistor.

17. A tunable capacitor, comprising:

a variable capacitor unit connected between a first terminal and a second terminal and including:

a first capacitor having one terminal and another terminal, the one terminal being connected to the first terminal, and a switching transistor connected to the another terminal of the first capacitor and configured to switch on/off the connection of the first capacitor between the first terminal and the second terminal; and an ESD protection circuit including a stacked transistor formed by connecting in series a plurality of MOS transistors, wherein a gate terminal and a body terminal of each of the plurality of MOS transistors are connected to the ground terminal, such that each MOS transistor maintains a turn-off state, and one of the plurality of MOS transistors is directly connected to the one terminal of the first capacitor.

* * * * *